(12) United States Patent
Hasegawa (10) Patent No.: US 7,589,020 B2
(45) Date of Patent: Sep. 15, 2009

(54) METHOD FOR DEPOSITING TITANIUM NITRIDE FILMS FOR SEMICONDUCTOR MANUFACTURING

(75) Inventor: Toshio Hasegawa, Delmar, NY (US)

(73) Assignee: Tokyo Electron Limited, Tokyo (JP)

( * ) Notice: Subject to any disclaimer, the term of this patent is extended or adjusted under 35 U.S.C. 154(b) by 138 days.

(21) Appl. No.: 11/743,548

(22) Filed: May 2, 2007

(65) Prior Publication Data
US 2008/0274624 A1 Nov. 6, 2008

(51) Int. Cl.
*H01L 21/44* (2006.01)
(52) U.S. Cl. .............. 438/681; 438/685; 257/E21.477; 257/E21.584; 427/343
(58) Field of Classification Search .......... 438/681, 438/677, 685; 427/343, 394, 255.21; 257/E21.477, 257/E21.478, E21.584, E21.586
See application file for complete search history.

(56) References Cited

U.S. PATENT DOCUMENTS

| | | | |
|---|---|---|---|
| 5,246,881 A | 9/1993 | Sandhu et al. | |
| 6,177,305 B1 | 1/2001 | Hornback et al. | |
| 6,194,310 B1 | 2/2001 | Hsu et al. | |
| 6,297,555 B1 | 10/2001 | Zhao et al. | |
| 6,468,604 B1 | 10/2002 | Tobe et al. | |
| 6,780,463 B2 | 8/2004 | Kim et al. | |
| 6,849,298 B2 | 2/2005 | Pyo | |
| 7,115,516 B2 | 10/2006 | Chen et al. | |
| 2002/0187261 A1* | 12/2002 | Pyo | 427/255.7 |
| 2006/0046477 A1 | 3/2006 | Rueger | |
| 2006/0110533 A1 | 5/2006 | Hwang et al. | |
| 2006/0128108 A1 | 6/2006 | Kim et al. | |
| 2006/0166425 A1* | 7/2006 | Triyoso et al. | 438/199 |
| 2006/0166427 A1* | 7/2006 | Akasaka | 438/199 |
| 2007/0026147 A1* | 2/2007 | Chen et al. | 427/248.1 |
| 2008/0085611 A1* | 4/2008 | Khandelwal et al. | 438/785 |
| 2008/0274622 A1* | 11/2008 | Rueger | 438/711 |

FOREIGN PATENT DOCUMENTS

EP 1691400 A1 8/2006

OTHER PUBLICATIONS

Shin, H.K. et al., MOCVD of Titanium Nitride from a New Precursor, Ti[N(CH3)C2H5]4, Chem. Mater. 1997, 9, pp. 76-80.

(Continued)

*Primary Examiner*—Caridad M Everhart
(74) *Attorney, Agent, or Firm*—Wood, Herron & Evans, LLP (57) ABSTRACT

Embodiments of the invention describe TiN deposition methods suitable for high volume manufacturing of semiconductor devices on large patterned substrates (wafers). One embodiment describes a chemical vapor deposition (CVD) process using high gas flow rate of a tetrakis(ethylmethylamino) titanium (TEMAT) precursor vapor along with an inert carrier gas at a low process chamber pressure that provides high deposition rate of conformal TiN films with good step coverage in surface reaction limited regime. Other embodiments describe cyclical TiN deposition methods using TEMAT precursor vapor and a nitrogen precursor.

18 Claims, 6 Drawing Sheets

OTHER PUBLICATIONS

Min, Jae-Sik et al., Atomic Layer Deposition of TiN Films by Alternate Supply of Tetrakis(ethylmethylamino)-Titanium and Ammonia, Jpn. J. Appl. Phys. vol. 37 (1998) pp. 4999-5004.

Lee, Jae Gab et al., Chemical Vapor Deposition of TiN Films from Tetrakis(ethylmethylamino)titanium and Ammonia, Jpn. J. Appl. Phys. vol. 37 (1998) pp. 6942-6945.

Lee, Jaegab et al., MOCVD of TiN and/or Ti from New Precursors, Thin Solid Films 320 (1998) pp. 15-19.

Panda, Siddhartha et al., Low Temperature Chemical Vapor Deposition of Titanium Nitride Films from Tetrakis(ethylmethylamino)titanium and Ammonia, Thin Solid Films 357 (1999) pp. 125-131.

Kim, Do-Heyoung et al., Characteristics of Chemically Vapor Deposited TiN Films Prepared Using Tetrakis-ethylmethyl-amido-titanium, J. Vac. Sci. Technol. B 17(5), Sep./Oct. 1999, pp. 2197-2203.

Kim, Seong Jae et al., Thermal Decomposition of Tetrakis(ethylmethylamido) Titanium for Chemical Vapor Deposition of Titanium Nitride, Bull. Korean Chem. Soc. 2006, vol. 27, No. 2, pp. 219-223.

U.S. Patent and Trademark Office, Non-final Office Action received in related U.S. Appl. No. 11/743,562 dated Jan. 8, 2009, 20 pp.

\* cited by examiner

METHOD FOR DEPOSITING TITANIUM NITRIDE FILMS FOR SEMICONDUCTOR MANUFACTURING

CROSS-REFERENCE TO RELATED APPLICATIONS

This application is related to U.S. patent application Ser. No. 11/743,562, entitled "METHOD FOR DEPOSITING TITANIUM NITRIDE FILMS FOR SEMICONDUCTOR MANUFACTURING," filed on even date herewith, the entire content of which is Hereby incorporated by reference.

FIELD OF THE INVENTION

The present invention relates to semiconductor processing, and more particularly to chemical vapor deposition and cyclical deposition methods suitable for high volume manufacturing of titanium nitride (TiN) films in semiconductor devices.

BACKGROUND OF THE INVENTION

Titanium nitride (TiN) films are widely used in semiconductor devices and ultra-large-scale integrated circuits. For example, TiN films have been used in semiconductor devices as a diffusion barrier for preventing metal diffusion into other materials. TiN films have been employed as a diffusion barrier against copper (Cu) diffusion, for example in contacts, vias and trenches. Other uses include metal wiring, contact plug, and upper electrode of a capacitor that prevents diffusion of dopants and other ions toward a lower region of a semiconductor device, such as toward a gate of a transistor, a dielectric layer of a capacitor, or the semiconductor substrate.

Early deposition methods for TiN films included reactive sputtering using a metallic titanium target and nitrogen gas. These deposition methods suffered from poor step coverage over high-aspect ratio features found in advanced semiconductor devices, thereby requiring development of new deposition methods able to provide conformal deposition of thin TiN films that must be as thin as possible to accommodate the higher aspect ratios of today's devices. The need for conformal deposition has led to chemical vapor deposition (CVD) methods, plasma-enhanced CVD (PECVD), and more recently atomic layer deposition (ALD) and plasma-enhanced ALD (PEALD) methods.

The reaction of $TiCl_4$ and $NH_3$ using substrate temperature in the range of about 500° C. to about 700° C. has commonly been used in a CVD process for depositing TiN films. Reaction byproducts from the CVD process include chlorine that may diffuse into the semiconductor substrate and deteriorate the electronic characteristics of the semiconductor device. More recently new CVD and ALD processes have been developed using other titanium sources such as titanium amide compounds that are free of chlorine and allow lower processing temperatures.

ALD of TiN films is a type of cyclical deposition that refers to sequential introduction of titanium and nitrogen precursors to deposit a thin film onto a substrate. In particular, the deposition may include sequential introduction of a pulse of a titanium precursor, followed by a pulse of a purge gas and/or a pump evacuation, followed by a pulse of a nitrogen precursor, which is followed by a pulse of a purge gas and/or a pump evacuation. Sequential introduction of separate pulses results in alternating self-limiting chemisorption of monolayers of each precursor on the surface of the substrate and forms on the order of a monolayer of deposited TiN in each cycle. The sequential introduction of precursors is repeated as necessary to form a TiN film that has a desired thickness. One drawback of ALD is that the growth rate for TiN can be very low compared to CVD methods. A typical growth rate of an ALD process is 1-2 angstroms (Å) per cycle.

Although these new CVD and ALD processes provide important temperature improvements over chlorine-based processes, they suffer from a variety of problems that make these processes unsatisfactory for advanced semiconductor manufacturing where film conformality, high step coverage over high-aspect ratio structures, and high deposition rate for high volume throughput are required. Accordingly, new processing methods for forming TiN films are required that can overcome these problems and limitations with prior art deposition methods.

SUMMARY OF THE INVENTION

Embodiments of the invention describe conformal TiN deposition methods that provide good film quality without degraded conformality. These methods are suitable for high-volume manufacturing of semiconductor devices on large patterned substrates (wafers). One embodiment describes a chemical vapor deposition (CVD) process using high gas flow rate of a tetrakis(ethylmethylamino)titanium (TEMAT) precursor vapor along with an inert carrier gas at a low process chamber pressure that provides high deposition rate of conformal TiN films with good step coverage in surface reaction limited regime. Other embodiments describe cyclical deposition methods using TEMAT precursor vapor and a nitrogen precursor.

BRIEF DESCRIPTION OF THE DRAWINGS

A more complete appreciation of the present invention and many attendant advantages thereof will be readily obtained as the same becomes better understood by reference to the following detailed description when considered in connection with the accompanying drawings, wherein.

DETAILED DESCRIPTION OF SEVERAL EMBODIMENTS

Embodiments of the invention describe processing methods that are suitable for deposition of TiN films for high volume manufacturing of semiconductor devices on large patterned substrates such as 200 mm, 300 mm, or even larger diameter substrates (wafers). The TiN films contain titanium (Ti) and nitrogen (N) but may also contain impurities such as carbon (C), oxygen (O) and hydrogen (H), that may become incorporated into the TiN films during deposition or during substrate transfer and exposure to an oxygen-containing environment such as air. In one example, the amount of C in the TiN films may be similar to or greater than that of Ti and N. In another example, the amounts of Ti, N, C, and O in air exposed TiN films may be similar.

According to embodiments of the invention, a titanium amide precursor, tetrakis(ethylmethylamino)titanium (TEMAT), is utilized for conformal TiN film deposition. TEMAT ($Ti(N(CH_3)C_2H_5)_4$) has a molecular weight of 280.32 g/mol, density of 0.95 g/cm, and is a yellow-orange liquid. TEMAT has a relative high vapor pressure of 0.4 Torr at 60° C., 1.0 Torr at 78° C., and 1.2 Torr at 80° C., and is therefore well suited as a precursor for TiN deposition.

Figure 1A:
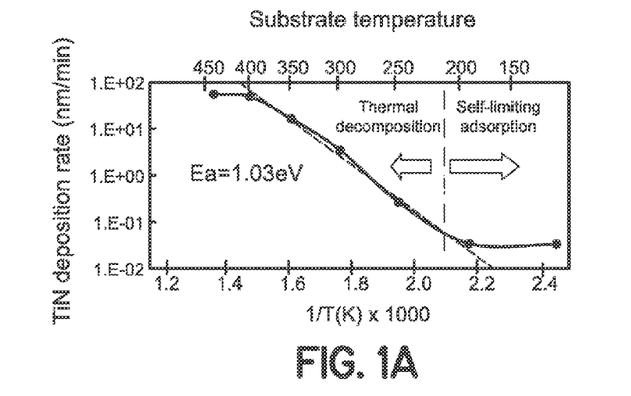
FIG. 1A shows TiN deposition rate as a function of substrate temperature using high flow rate of TEMAT precursor vapor and low process pressure.

Referring now to the drawings, FIG. 1A shows TiN deposition rate as a function of substrate temperature using high flow rate of TEMAT precursor vapor (greater than 5 sccm) and low process pressure (less than 1 Torr). A self-limiting adsorption regime is observed for TEMAT below about 200° C., where of the order of one monolayer of TEMAT precursor is adsorbed on the substrate surface, thereby saturating the surface and preventing further adsorption of the TEMAT precursor. At substrate temperatures above about 200° C., the TEMAT precursor thermally decomposes on the substrate with an activation energy (Ea) of 1.03 eV and the TiN deposition rate and the resulting TiN film thickness are proportional to the duration of the TEMAT precursor vapor exposure.

In FIG. 1A, the temperature range between 200° C. and less than 400° C. is referred to as the surface reaction limited regime where TiN deposition rate increases with increasing substrate temperature for a given TEMAT precursor flow. In order to obtain conformal TiN deposition over patterned substrates with good step coverage over high-aspect ratio features, the TiN deposition process is preferably carried out in the surface reaction limited regime. At a substrate temperature of 400° C. and greater, the TiN deposition is in a mass flow limited regime where non-conformal TiN film deposition is observed and the deposition rate is independent of temperature but dependent on TEMAT precursor flow. Film step coverage is traditionally considered to be a function of reactive sticking coefficient and surface mobility, where surface reaction limited conditions have a lower sticking coefficient and higher surface mobility than mass flow limited conditions.

Embodiments of the invention provide a method for surface reaction limited decomposition of TEMAT at a substrate temperature greater than 300° C. and less than 400° C., at high gas flow rate of TEMAT precursor vapor, and at a process chamber pressure less than 1 Torr. The current inventors have realized that these processing conditions allow extending of the available temperature range for surface reaction limited TiN deposition over prior art teachings where a transition region between surface reaction limited regime and mass flow limited regime has been reported between 325° C. and 350° C. using a process chamber pressure of 1 Torr. This extending of the surface reaction limited regime to higher temperature provides the high deposition rates of conformal TiN films in the surface reaction limited regime desired for high volume manufacturing of semiconductor devices on large patterned substrates.

Figure 1B:
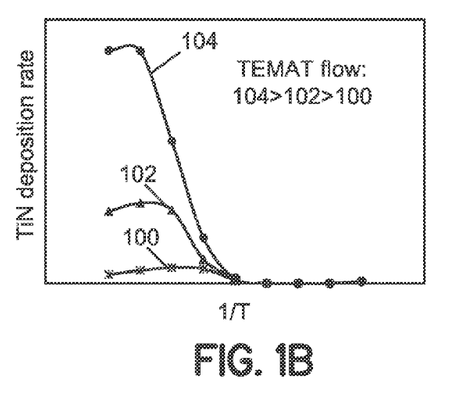
FIG. 1B shows TiN deposition rate as a function of substrate temperature for different gas flow rates of TEMAT precursor vapor according to embodiments of the invention.

FIG. 1B shows TiN deposition rate as a function of substrate temperature for different gas flow rates of TEMAT precursor vapor according to embodiments of the invention. FIG. 1B illustrates that the substrate reaction limited regime is extended to higher substrate temperatures and provides higher TiN deposition rates as the TEMAT precursor vapor gas flow rate is increased (i.e., 104>102>100). According to embodiments of the invention, a gas flow rate of TEMAT precursor vapor is greater than 5 sccm, and in some embodiments greater than 7.5, 10, 12.5, or even greater than 15 sccm. The gas flow of an inert carrier gas is greater than 50 sccm, and in some embodiments greater than 100, 200, 300, or even greater than 400 sccm. Furthermore, high temperature in a precursor vaporization system containing the TEMAT precursor liquid is utilized to provide the high gas flow rate of the TEMAT precursor vapor. In particular, a TEMAT precursor liquid temperature greater than 70° C. is required, for example 80° C., or even greater than 80° C.

Figure 2:
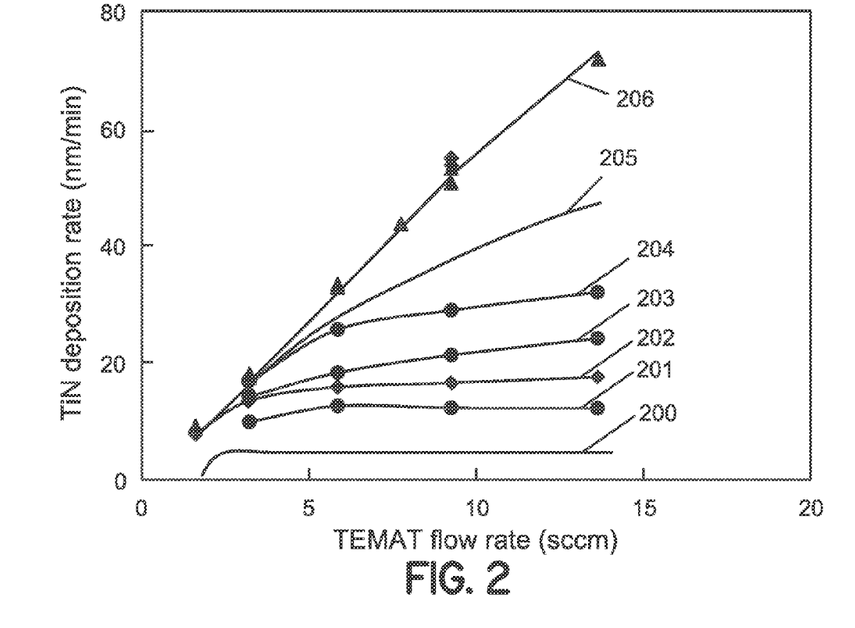
FIG. 2 illustrates TiN deposition rates as a function of TEMAT precursor gas flow rate for a CVD process according to embodiments of the invention.

FIG. 2 illustrates TiN deposition rates as a function of TEMAT precursor gas flow rate for a CVD process according to embodiments of the invention. The TiN films were deposited using a process gas containing TEMAT precursor vapor, and an Ar carrier gas flow rate of 400 sccm was utilized to aid in the transfer of the TEMAT precursor vapor to the process chamber. TiN deposition results described by curves 201-204 utilized a substrate temperature of 350° C., and process chamber pressures of 0.05 Torr, 0.15 Torr (using additional 400 sccm of Ar dilution gas), 0.15 Torr, and 0.5 Torr, respectively. Curves 200 and 205 show estimated TiN deposition rates for substrate temperatures of 300° C. and 350° C., respectively, using a process chamber pressure of 1 Torr. Furthermore, TiN deposition results described by curve 206 utilized substrate temperatures of 400° C.-500° C., and process chamber pressures between 0.05 Torr and 1 Torr.

The deposited TiN films corresponding to curves 201-204 were conformal with good step coverage when the gas flow rate of the TEMAT precursor vapor was greater than 5 sccm. In comparison, the TiN deposition conditions corresponding to curves 200, 205, and 206 are not useful for high volume manufacturing of semiconductor devices on large patterned substrates due to low TiN deposition rate (curve 200) and non-conformal film deposition coupled with poor step coverage (curves 205 and 206). Therefore, according to embodiments of the invention, and described by curves 201-204, a gas flow rate of TEMAT precursor vapor is greater than 5 sccm. In one example, the gas flow rate of the TEMAT precursor vapor is greater than 5 sccm and less than 20 sccm. Furthermore, the process chamber pressure is less than 1 Torr and in some embodiments less than 0.5 Torr, less than 0.15 Torr, or even less than 0.05 Torr. In one example, the process chamber pressure can be between 0.05 Torr and less than 1 Torr, and in another example, between 0.05 Torr and 0.5 Torr. Still further, the substrate temperature is greater than 300° C. and less than 400° C., or between 350° C. and less than 400° C. In one example, substrate temperature can be about 350° C.

Representative properties of the TiN films corresponding to curves 201-204 included electrical resistivity of about 7,000 μohm-cm, N/Ti ratio of 1.05-0.88, Ti-content between 21 and 26 atomic percent, N-content between 22 and 23 atomic percent, carbon(C)-content between 24 and 29 atomic percent, and oxygen(O)-content between 27 and 28 atomic percent. The TiN films were exposed to air after deposition and inherent low density due to porous film structure and impurities (oxygen and carbon) may account for the high electrical resistivity of the TiN films.

Thus, according to the embodiments described above, a TiN film may be deposited on a substrate in a surface reaction limited regime by heating the substrate to a temperature greater than 300° C. and less than 400° C., exposing the heated substrate to a process gas that includes TEMAT precursor in an inert carrier gas at a TEMAT precursor vapor flow rate greater than 5 sccm, and maintaining the process chamber at a pressure less than 1 Torr during the exposure.

Figure 3A:
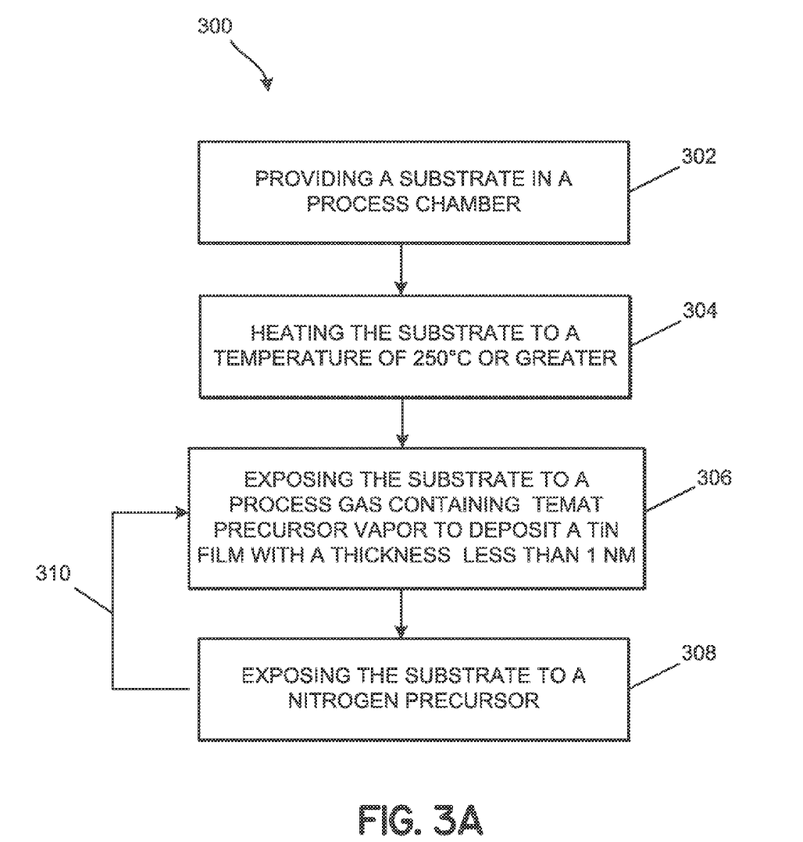
FIG. 3A is a process flow diagram for depositing a TiN film on a substrate using a cyclical CVD process according to an embodiment of the invention.

FIG. 3A is a process flow diagram for depositing a TiN film on a substrate using a cyclical CVD process according to another embodiment of the invention. The process flow diagram 300 includes, in step 302, providing a substrate in a process chamber and, in step 304, heating the substrate to a temperature of 250° C. or greater. The method further includes performing a sequential deposition cycle including, in step 306, exposing the substrate to a process gas containing TEMAT precursor vapor to deposit a TiN film with a thickness less than 1 nm (nm=nanometer ($10^{-9}$ m)). According to other embodiments of the invention, the thickness can be less than 0.5 nm. In step 308, the TiN film deposited in step 306 is exposed to a nitrogen precursor to incorporate additional nitrogen into the TiN film and remove carbon reaction products from the TiN film. The nitrogen precursor can, for example, contain ammonia ($NH_3$), dimethylamine ($N(CH_3)_2$), diethylamine ($N(C_2H_5)_2$), hydrazine ($N_2H_4$), or $C_1$-$C_{10}$ hydrazine compounds. Common $C_1$ and $C_2$ alkylhydrazine compounds include monomethyl-hydrazine ($MeNHNH_2$), 1,1-dimethyl-hydrazine ($Me_2NNH_2$), and 1,2-dimethyl-hydrazine (MeNHNHMe). According to one embodiment of the invention, process flow diagram 300 can be a cyclical PECVD process where the nitrogen precursor in step 306 includes a plasma-excited nitrogen precursor, where the precursor contains $N_2$, $NH_3$, $N(CH_3)_2$, $N(C_2H_5)_2$, $N_2H_4$, or $C_1$-$C_{10}$ hydrazine compounds.

As illustrated by process flow arrow 310, a deposition cycle containing steps 306 and 308 may be repeated until the TiN film has a predetermined total thickness. The process gas can further contain an inert gas selected from a noble gas and $N_2$. The inert gas is utilized as a carrier gas for the TEMAT precursor vapor and optionally also as a dilution gas. According to one embodiment, the dilution gas can contain $H_2$. The deposition cycle can further include a pulse of an inert purge gas and/or a pump evacuation after at least one of the exposure steps 306 and 308.

The cyclical CVD (or PECVD) process described in process flow diagram 300 of FIG. 3A utilizes a substrate temperature where the TEMAT precursor thermally decomposes and deposits a plurality of Ti and N atomic layers in each cycle. The thermal decomposition behavior of the cyclical CVD process results in higher deposition rates than conventional ALD processing, where about one monolayer of TiN is formed in each deposition cycle using self-limiting adsorption of TEMAT precursor vapor at a substrate temperature of about 200° C., or lower. Therefore, the cyclical CVD process provides a TiN film deposition rate that is greater than is achieved by ALD processing while providing conformal film deposition with good step coverage. This enables high-volume manufacturing of semiconductor devices containing TiN films.

Exemplary processing conditions for process flow diagram 300 include a gas flow rate of TEMAT precursor vapor that is greater than 5 sccm and in some embodiments greater than 7.5, 10, 12.5, or even greater than 15 sccm. A gas flow of the inert carrier gas is greater than 50 sccm and in some embodiments greater than 100, 200, 300, or even greater than 400 sccm. A gas flow of the nitrogen precursor can be greater than 10 sccm and in some embodiments greater than 20, 50, 100, or even greater than 200 sccm. The TEMAT precursor liquid temperature can be greater than 70° C., for example 80° C., or even greater than 80° C.

Figure 3B:
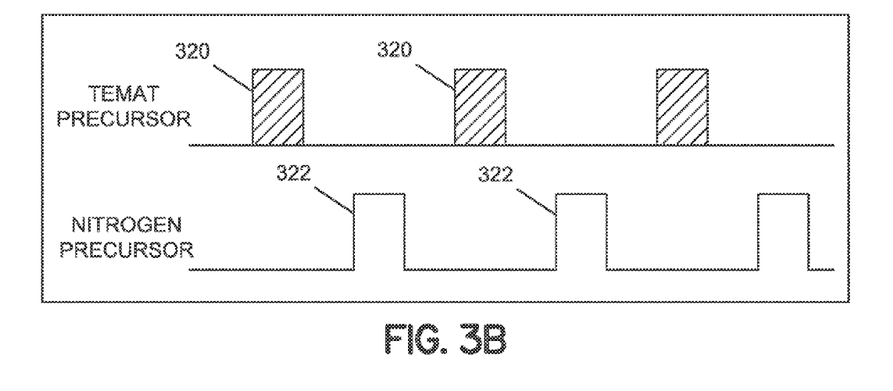
FIG. 3B is a schematic gas flow diagram for depositing a TiN film on a substrate using a cyclical CVD process according to an embodiment of the invention.

FIG. 3B is a schematic gas flow diagram for depositing a TiN film on a substrate using a cyclical CVD process according to an embodiment of the invention. FIG. 3B depicts exposing a substrate to a TEMAT precursor vapor pulse 320 corresponding to step 306 of FIG. 3A, and exposing the substrate to a nitrogen precursor pulse 322 corresponding to step 308. Steps 306 and 308 are repeated until the TiN film has a predetermined total thickness.

Figure 3C:
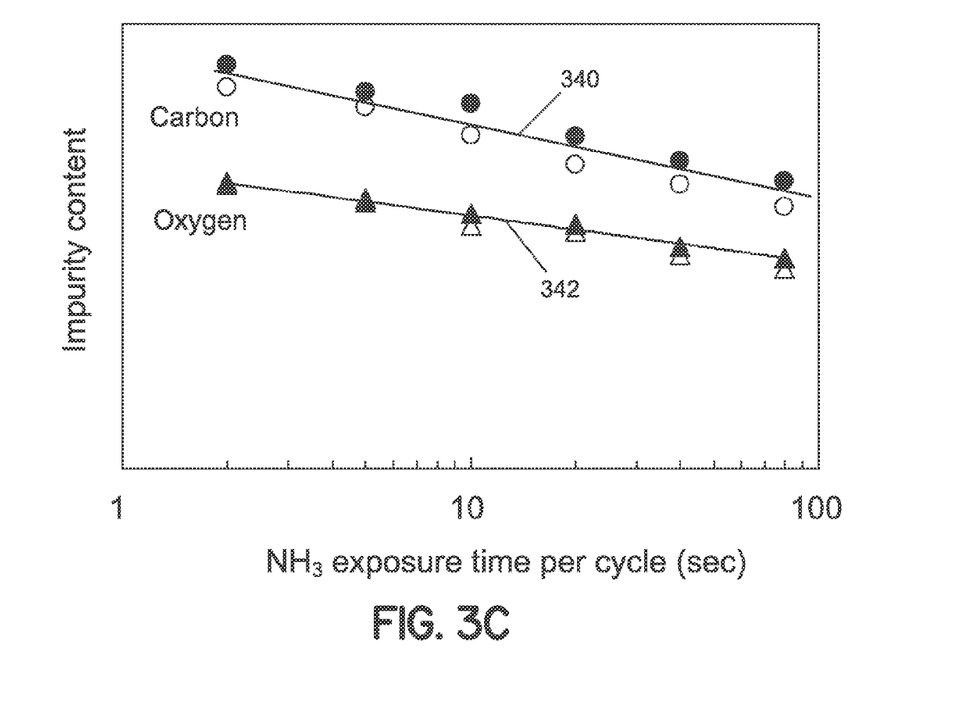
FIG. 3C shows relative carbon and oxygen impurity levels in TiN films as a function of $NH_3$ exposure time per cycle.
Figure 3D:
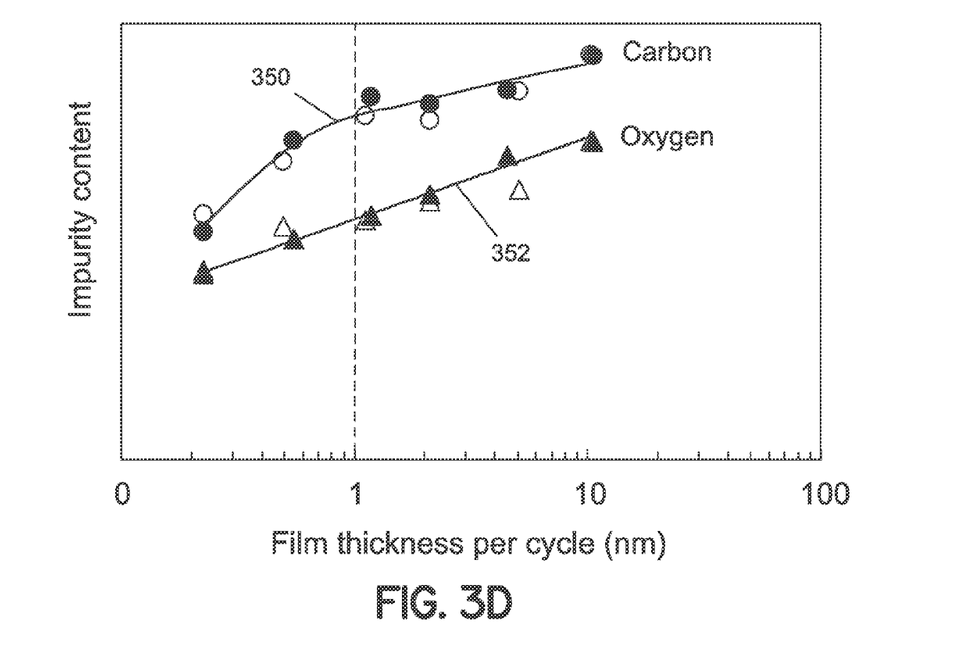
FIG. 3D shows relative carbon and oxygen impurity levels as a function of TiN film thickness per cycle.

FIG. 3C shows relative carbon and oxygen impurity levels in TiN films as a function of $NH_3$ exposure time per cycle, and FIG. 3D shows relative carbon and oxygen impurity levels as a function of TiN film thickness per cycle. The cyclical CVD process utilized alternating TEMAT and $NH_3$ exposures as depicted in FIG. 3B. In FIG. 3C, the cyclical CVD process utilized 20 deposition cycles to deposit a total of 10 nm of TiN (0.5 nm in each deposition cycle) at a substrate temperature of 350° C. The carbon impurity curve 340 and the oxygen impurity curve 342 show that carbon and oxygen impurity levels in the TiN film are effectively decreased with increasing $NH_3$ exposure time in each deposition cycle. The cyclical CVD process in FIG. 3D deposited a total TiN thickness of 10 nm but the number of deposition cycles and the TiN thickness deposited in each deposition cycle was varied. The total $NH_3$ exposure time was 400 sec. FIG. 3D shows carbon impurity curve 350 and oxygen impurity curve 352. In one example, a 10 nm thick TiN film was deposited using 20 deposition cycles of 0.5 nm TiN deposition and a 20 sec $NH_3$ exposure in each deposition cycle. In another example, a 10 nm thick TiN film was deposited using a single deposition cycle of 10 nm TiN and a single 400 sec exposure of $NH_3$. FIGS. 3C and 3D demonstrate that carbon and oxygen impurity content of the TiN films can be reduced by increasing $NH_3$ flow time per deposition cycle and reducing the TiN thickness deposited in each deposition cycle. In particular, depositing a TiN thickness below 1 nm, or below 0.5 nm, in each deposition cycle, enables efficient reduction in the carbon and oxygen impurity content of the TiN film.

Figure 4A:
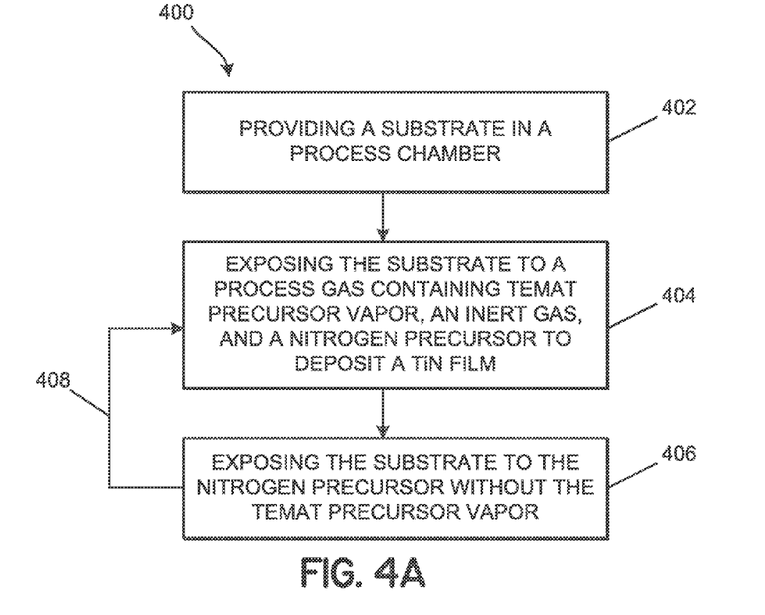
FIG. 4A is a process flow diagram for depositing a TiN film on a substrate using a cyclical CVD process according to another embodiment of the invention.

FIG. 4A is a process flow diagram for depositing a TiN film on a substrate using a cyclical CVD process according to another embodiment of the invention. The cyclical CVD (or PECVD) process described in process flow diagram 400 of FIG. 4A utilizes a substrate temperature where the TEMAT precursor thermally reacts with the nitrogen precursor and deposits a plurality of Ti and N atomic layers in each cycle. The process flow diagram 400 is similar to the process flow diagram 300 described in reference to FIG. 3, and includes, in step 402, providing a substrate in a process chamber, and performing a sequential deposition cycle. The sequential deposition cycle includes, in step 404, exposing the substrate to a process gas containing TEMAT precursor vapor and a nitrogen precursor to deposit a TiN film. The nitrogen precursor can contain $NH_3$, $N(CH_3)_2$, $N(C_2H_5)_2$, $N_2H_4$, or $C_1$-$C_{10}$ hydrazine compounds. The process gas further contains an inert gas selected from a noble gas and $N_2$. The inert gas is utilized as a carrier gas and optionally also as a dilution gas. According to one embodiment, the dilution gas can contain $H_2$.

In step 406, the TiN film is exposed to the nitrogen precursor without the TEMAT precursor vapor to incorporate additional nitrogen into the TiN film and remove carbon reaction products from the TiN film. According to one embodiment of the invention, the process flow diagram 400 can be a cyclical PECVD process where the nitrogen precursor in step 404, step 406, or both steps 404 and 406, includes a plasma-excited nitrogen precursor, where the precursor contains $N_2$, $NH_3$, $N(CH_3)_2$, $N(C_2H_5)_2$, $N_2H_4$, or $C_1$-$C_{10}$ hydrazine compounds. As illustrated by process flow arrow 408, deposition cycle containing steps 404 and 406 may be repeated until the TiN film has a predetermined total thickness. The deposition cycle can further include a pulse of an inert purge gas and/or a pump evacuation after at least one of the exposure steps 404 and 406.

Exemplary processing conditions for process flow diagram 400 include a gas flow rate of TEMAT precursor vapor that is greater than 5 sccm and in some embodiments greater than 7.5, 10, 12.5, or even greater than 15 sccm. A gas flow of the inert carrier gas is greater than 50 sccm and in some embodiments greater than 100, 200, 300, or even greater than 400 sccm. A gas flow of the nitrogen precursor can be greater than 10 sccm and in some embodiments greater than 20, 50, 100, or even greater than 200 sccm. The TEMAT precursor liquid temperature can be greater than 70° C., for example 80° C., or even greater than 80° C.

Figure 4B:
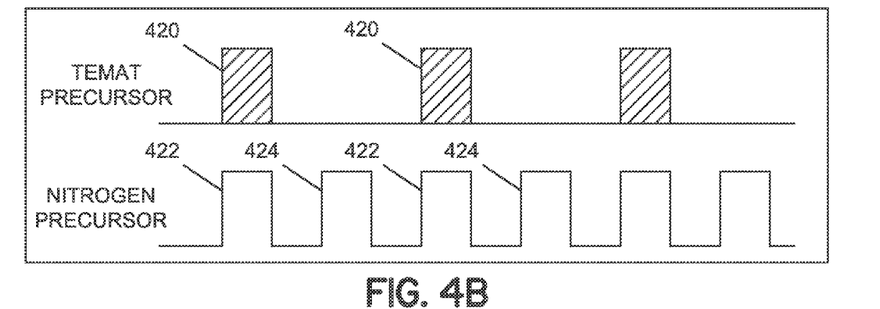
FIGS. 4B and 4C are schematic gas flow diagrams for depositing a TiN film on a substrate using a cyclical CVD process according to embodiments of the invention.
Figure 4C:
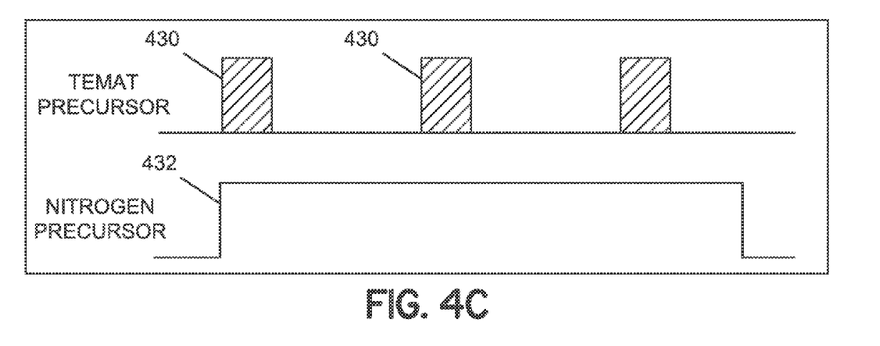

FIG. 4B is a schematic gas flow diagram for depositing a TiN film on a substrate using a cyclical CVD process according to an embodiment of the invention. FIG. 4B depicts exposing a substrate to a TEMAT precursor vapor pulse 420 and a nitrogen precursor pulse 422 corresponding to step 404 of FIG. 4A, and exposing the substrate to a nitrogen precursor pulse 424 corresponding to step 406. Steps 404 and 406 may be repeated until the TiN film has a predetermined total thickness. FIG. 4C depicts exposing a substrate to a plurality of TEMAT precursor vapor pulses 430 and continuous flow of a nitrogen precursor 432. Thus, the substrate is exposed to the nitrogen precursor both with the TEMAT precursor and without the TEMAT precursor, but in continuous fashion rather than the pulsed fashion depicted in FIG. 4B. The TEMAT precursor vapor pulses 430 are repeated until the TiN film has a predetermined total thickness.

The TEMAT precursor vapor and the nitrogen precursor may react in the gas phase, thereby reducing the amount of TEMAT precursor available for TiN deposition and creating particle problems in the process chamber and in the TiN film. In order to reduce or prevent this problem, the TEMAT precursor vapor and the nitrogen precursor may be separately introduced into a processing zone above the substrate surface.

According to embodiments of the invention, the TiN film may be post-treated in the presence of a plasma following deposition to incorporate (stuff) additional nitrogen into the TiN film. The post-treating can also reduce the amount of carbon in at least a portion of the TiN film thickness. The post-treating may be performed in the same process chamber as the depositing or the post-treating may be performed in a different process chamber than the depositing. In one example, the post-treating may be performed by exposing the TiN film to a nitrogen precursor in a process chamber containing a slot plane antenna (SPA) plasma source.

Figure 5:
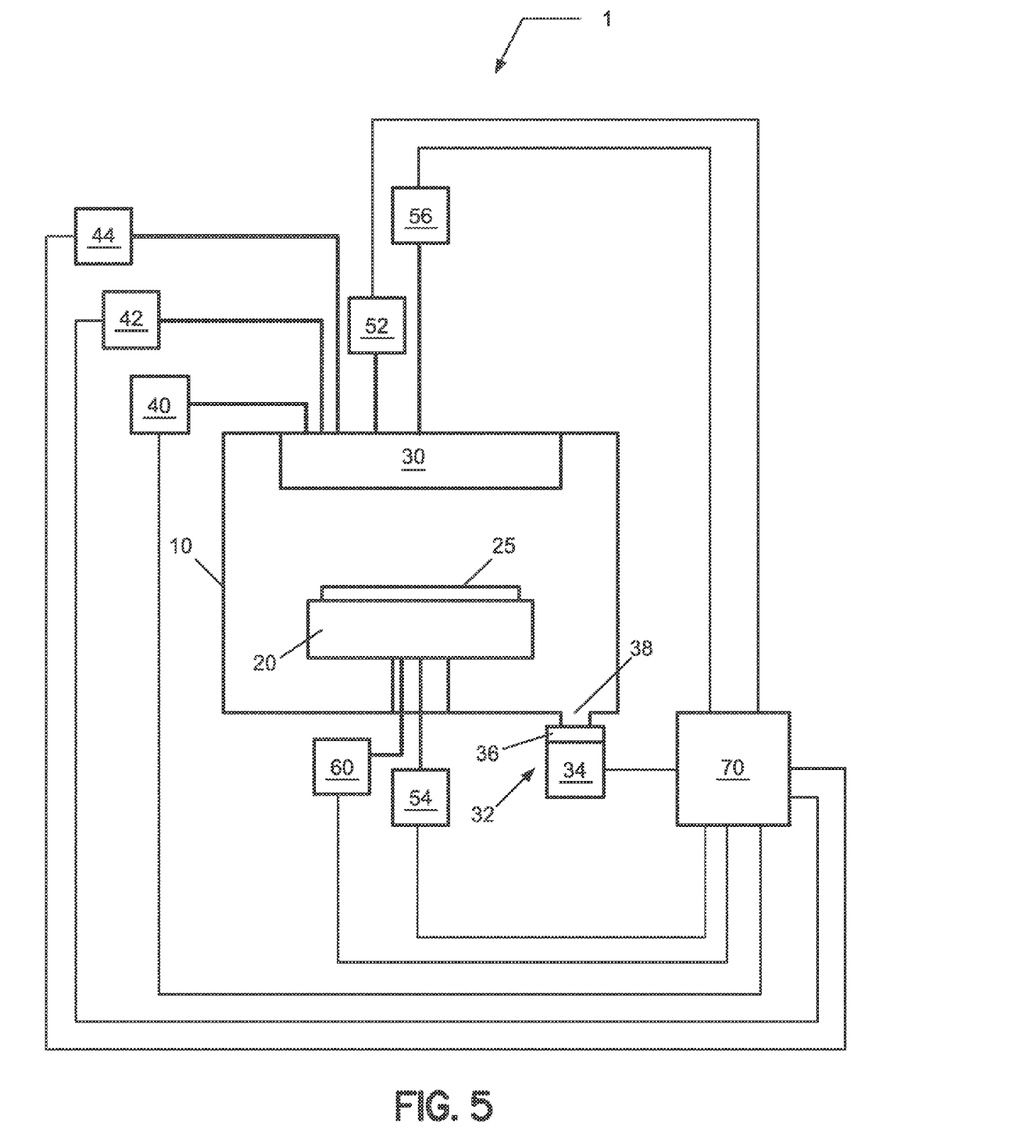
FIG. 5 is a schematic view of an exemplary processing system for depositing TiN films according to embodiments of the invention.

FIG. 5 is a schematic view of an exemplary processing system for depositing TiN films according to embodiments of the invention. The processing system 1 can be configured to perform a CVD process, a cyclical CVD process, a cyclical PECVD process, or a combination of two or more of these processes. Furthermore, the processing system 1 may be utilized for post-treating the TiN films. The processing system 1 includes a process chamber 10 having a substrate holder 20 configured to support a substrate 25, upon which the TiN film is formed. The process chamber 10 further contains an upper assembly 30 (e.g., a showerhead) configured for introducing gases into the process chamber 10. The upper assembly 30 is coupled to a TEMAT precursor vapor supply system 40, a nitrogen precursor supply system 42, and a purge gas supply system 44. The upper assembly 30 may be configured for separately introducing TEMAT precursor vapor and a nitrogen precursor into a processing zone above the substrate 25, in order to reduce or prevent gas phase reaction between the TEMAT precursor vapor and the nitrogen precursor.

Additionally, the processing system 1 includes a substrate temperature control system 60 coupled to substrate holder 20 and configured to elevate and control the temperature of the substrate 25. The substrate temperature control system 60 is coupled to the substrate holder 20 and configured to elevate and control the temperature of substrate 25. Substrate temperature control system 60 comprises temperature control elements, such as a cooling system including a re-circulating coolant flow that receives heat from substrate holder 20 and transfers heat to a heat exchanger system (not shown), or when heating, transfers heat from the heat exchanger system. Additionally, the temperature control elements can include heating/cooling elements, such as resistive heating elements, or thermo-electric heaters/coolers, which can be included in the substrate holder 20, as well as the chamber wall of the process chamber 10 or any other component within the processing system 1. The substrate temperature control system 60 can, for example, be configured to elevate and control the substrate temperature from room temperature to approximately 400° C.

In order to improve the thermal transfer between substrate 25 and substrate holder 20, substrate holder 20 can include a mechanical clamping system, or an electrical clamping system, such as an electrostatic clamping system, to affix substrate 25 to an upper surface of substrate holder 20. Furthermore, substrate holder 20 can further include a substrate backside gas delivery system configured to introduce gas to the back-side of substrate 25 in order to improve the gas-gap thermal conductance between substrate 25 and substrate holder 20. Such a system can be utilized when temperature control of the substrate is required at elevated or reduced temperatures. For example, the substrate backside gas system can comprise a two-zone gas distribution system, wherein the helium gas gap pressure can be independently varied between the center and the edge of substrate 25.

Still referring to FIG. 5, the processing system 1 may be configured to process 200 mm substrates, 300 mm substrates, or larger-sized substrates. In fact, it is contemplated that the processing system 1 may be configured to process substrates, wafers, or LCDs regardless of their size, as would be appreciated by those skilled in the art. Therefore, while embodiments of the invention are described in connection with the processing of a semiconductor substrate, the invention is not limited solely thereto.

The TEMAT precursor vapor supply system 40 contains a precursor vaporization system (not shown) in fluid communication with the process chamber 10. The precursor vaporization system is configured for flowing an inert carrier gas with a gas flow rate greater than 50 sccm through or over a liquid TEMAT precursor vaporized at a temperature greater than 70° C., where the inert carrier gas captures the TEMAT precursor vapor and transports the vapor to the process chamber 10.

The TEMAT precursor vapor supply system 40, the nitrogen precursor supply system 42, and the purge gas supply system 44 are configured to simultaneously or alternately introduce gases to process chamber 10. The alternation of the introduction of the gases can be cyclical, or it may be acyclical with variable time periods between introduction of the TEMAT precursor vapor and the nitrogen precursor.

Still referring to FIG. 5, the purge gas supply system 44 is configured to introduce a purge gas to process chamber 10. For example, the introduction of a purge gas may occur between introduction of pulses of a TEMAT precursor vapor and a nitrogen precursor to the process chamber 10. The purge gas can comprise an inert gas, such as a noble gas (i.e., He, Ne, Ar, Kr, Xe), or nitrogen ($N_2$).

Furthermore, the process chamber 10 of FIG. 5 is further coupled to a pressure control system 32, including a vacuum pumping system 34, a valve 36, and a duct 38, wherein the pressure control system 32 is configured to controllably evacuate the process chamber 10 to a pressure suitable for forming the TiN film on substrate 25. The vacuum pumping system 34 can include a turbo-molecular vacuum pump (TMP) or a cryogenic pump, and valve 36 can include a gate valve for throttling the chamber pressure. Moreover, a device for monitoring chamber pressure (not shown) can be coupled to the process chamber 10. The pressure measuring device can be an absolute capacitance manometer. The pressure control system 32 can, for example, be configured to control the process chamber pressure at less than 1 Torr during deposition of the TiN film.

The TEMAT precursor vapor supply system 40, nitrogen precursor supply system 42, and purge gas supply system 44 can include one or more pressure control devices, one or more flow control devices, one or more filters, one or more valves, and/or one or more flow sensors. The flow control devices can include pneumatic driven valves, electromechanical (solenoidal) valves, and/or high-rate pulsed gas injection valves. According to embodiments of the invention, gases may be sequentially and alternately pulsed into the process chamber 10, where the length of each gas pulse can, for example, be between about 0.1 sec and about 100 sec. Alternately, the length of each gas pulse can be between about 1 sec and about 10 sec.

The processing system 1 further includes a plasma generation system configured to generate a plasma during at least a portion of the gas exposures in the process chamber 10. According to one embodiment of the invention, plasma-excited nitrogen precursor may be formed from a nitrogen precursor-containing gas containing $N_2$, $NH_3$, $N(CH_3)_2$, $N(C_2H_5)_2$, $N_2H_4$, or $C_1$-$C_{10}$ hydrazine compounds. Furthermore, the plasma generation system may be utilized to post-treat a TiN film to incorporate additional nitrogen into the TiN film.

The plasma generation system includes a first power source 52 coupled to the process chamber 10, and configured to couple power to gases introduced into the process chamber 10. The first power source 52 may be a variable power source and may include a radio frequency (RF) generator and an impedance match network, and may further include an electrode through which RF power is coupled to the plasma in process chamber 10. The electrode can be formed in the upper assembly 30, and it can be configured to oppose the substrate holder 20. The impedance match network can be configured to optimize the transfer of RF power from the RF generator to the plasma by matching the output impedance of the match network with the input impedance of the process chamber 10, including the electrode, and plasma. For instance, the impedance match network serves to improve the transfer of RF power to plasma in process chamber 10 by reducing the reflected power. Match network topologies (e.g. L-type, π-type, T-type, etc.) and automatic control methods are well known to those skilled in the art.

Alternatively, the first power source 52 may include a RF generator and an impedance match network, and may further include an antenna, such as an inductive coil, through which RF power is coupled to plasma in process chamber 10. The antenna can, for example, include a helical or solenoidal coil, such as in an inductively coupled plasma source or helicon source, or it can, for example, include a flat coil as in a transformer coupled plasma source.

Still alternatively, the first power source 52 may include a microwave frequency generator, and may further include a microwave antenna and microwave window through which microwave power is coupled to plasma in process chamber 10. The coupling of microwave power can be accomplished using electron cyclotron resonance (ECR) technology, or it may be employed using surface wave plasma technology, such as a slotted plane antenna (SPA), as described in U.S. Pat. No. 5,024,716.

According to one embodiment of the invention, the processing system 1 includes a substrate bias generation system configured to generate or assist in generating a plasma (through biasing of substrate holder 20) during at least a portion of the alternating introduction of the gases to the process chamber 10. The substrate bias system can include a substrate power source 54 coupled to the process chamber 10, and configured to couple power to the substrate 25. The substrate power source 54 may include a RF generator and an impedance match network, and may further include an electrode through which RF power is coupled to substrate 25. The electrode can be formed in substrate holder 20. For instance, substrate holder 20 can be electrically biased at a RF voltage via the transmission of RF power from a RF generator (not shown) through an impedance match network (not shown) to substrate holder 20. A typical frequency for the RF bias can range from about 0.1 MHz to about 100 MHz, and can be 13.56 MHz. RF bias systems for plasma processing are well known to those skilled in the art. Alternatively, RF power is applied to the substrate holder electrode at multiple frequencies. Although the plasma generation system and the substrate bias system are illustrated in FIG. 5 as separate entities, they may indeed comprise one or more power sources coupled to substrate holder 20.

In addition, the processing system 1 includes a remote plasma system 56 for providing and remotely plasma exciting a gas (e.g., a nitrogen precursor) prior to flowing the plasma-excited gas into the process chamber 10 where it is exposed to the substrate 25. The remote plasma system 56 can, for example, contain a microwave frequency generator.

The processing system 1 includes a controller 70 than can be used to configure any number of processing elements of the processing system 1, and the controller 70 can collect, provide, process, store, and display data from processing elements. The controller 70 can comprise a number of applications for controlling one or more of the processing elements. For example, controller 70 can include a graphic user interface (GUI) component (not shown) that can provide easy to use interfaces that enable a user to monitor and/or control one or more processing elements. Alternatively, or in addition, controller 70 can be coupled to one or more additional controllers/computers (not shown), and controller 70 can obtain setup and/or configuration information from an additional controller/computer.

The controller 70 can comprise a microprocessor, memory, and a digital I/O port capable of generating control voltages sufficient to communicate and activate inputs of the processing elements of the processing system 1 as well as monitor outputs from the processing system 1. For example, a program stored in the memory may be utilized to activate the inputs to the aforementioned components of the processing system 1 according to a process recipe in order to perform an etching process, or a deposition process.

However, the controller 70 may be implemented as a general-purpose computer system that performs a portion or all of the microprocessor based processing steps of the invention in response to a processor executing one or more sequences of one or more instructions contained in a memory. Such instructions may be read into the controller memory from another computer readable medium, such as a hard disk or a removable media drive. One or more processors in a multi-processing arrangement may also be employed as the controller microprocessor to execute the sequences of instructions contained in main memory. In alternative embodiments, hard-wired circuitry may be used in place of or in combination with software instructions. Thus, embodiments are not limited to any specific combination of hardware circuitry and software.

The controller 70 includes at least one computer readable medium or memory, such as the controller memory, for holding instructions programmed according to the teachings of the invention, and for containing data structures, tables, records, or other data that may be necessary to implement the present invention. Examples of computer readable media are compact discs, hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other optical medium, punch cards, paper tape, or other physical medium with patterns of holes, a carrier wave (described below), or any other medium from which a computer can read.

Stored on any one, or on a combination, of computer readable media is software for controlling the controller 70, for driving a device or devices for implementing the invention, and/or for enabling the controller to interact with a human user. Such software may include, but is not limited to, device drivers, operating systems, development tools, and applications software. Such computer readable media further includes the computer program product of the present invention for performing all or a portion (if processing is distributed) of the processing performed in implementing the invention.

The computer code devices may be any interpretable or executable code mechanism, including but not limited to scripts, interpretable programs, dynamic link libraries (DLLs), Java classes, and complete executable programs. Moreover, parts of the processing of the present invention may be distributed for better performance, reliability, and/or cost.

The term "computer readable medium" as used herein refers to any medium that participates in providing instructions to the processor of the controller 70 for execution. A computer readable medium may take many forms, including but not limited to, non-volatile media, volatile media, and transmission media. Non-volatile media includes, for example, optical, magnetic disks, and magneto-optical disks, such as the hard disk or the removable media drive. Volatile media includes dynamic memory, such as the main memory.

Moreover, various forms of computer readable media may be involved in carrying out one or more sequences of one or more instructions to processor of controller for execution. For example, the instructions may initially be carried on a magnetic disk of a remote computer. The remote computer can load the instructions for implementing all or a portion of the present invention remotely into a dynamic memory and send the instructions over a network to the controller 70.

The controller 70 may be locally located relative to the processing system 1, or it may be remotely located relative to the processing system 1. For example, the controller 70 may exchange data with the processing system 1 using at least one of a direct connection, an intranet, the Internet and a wireless connection. The controller 70 may be coupled to an intranet at, for example, a customer site (i.e., a device maker, etc.), or it may be coupled to an intranet at, for example, a vendor site (i.e., an equipment manufacturer). Additionally, for example, the controller 70 may be coupled to the Internet. Furthermore, another computer (i.e., controller, server, etc.) may access, for example, the controller 70 to exchange data via at least one of a direct connection, an intranet, and the Internet. As also would be appreciated by those skilled in the art, the controller 70 may exchange data with the processing system 1 via a wireless connection.

Alternately, a batch processing system capable of processing multiple substrates simultaneously may be utilized for forming the TiN films described in the embodiments of the invention.

Figure 6:
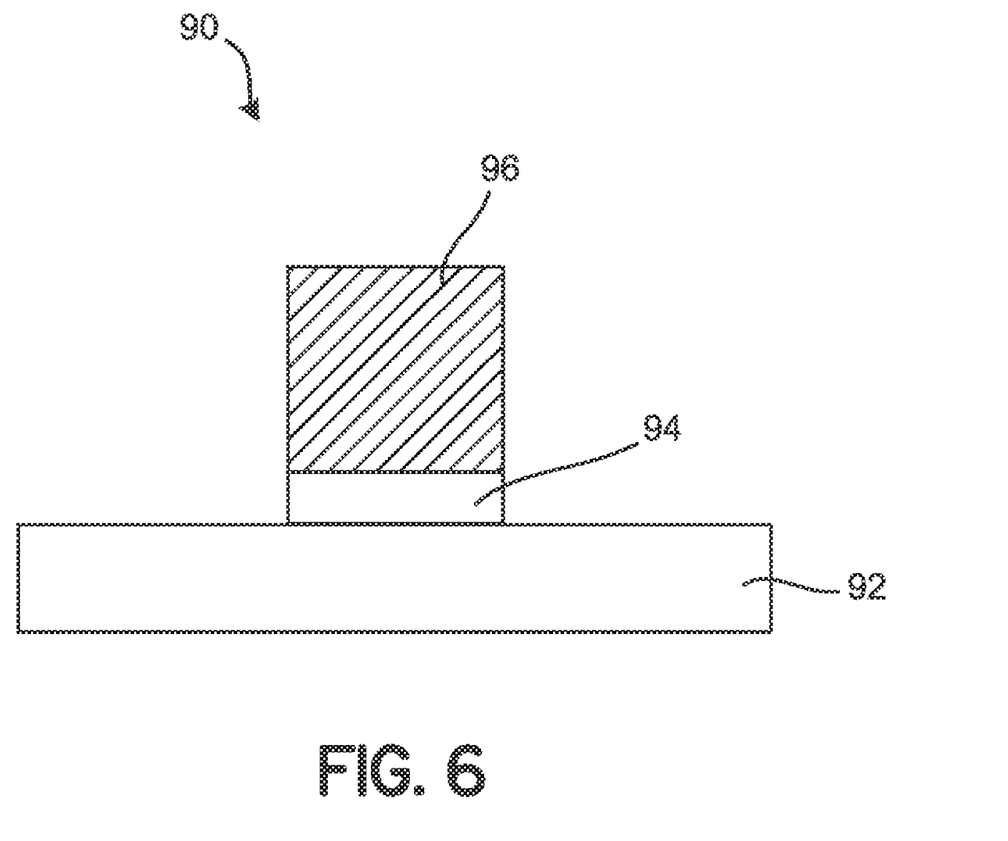
FIG. 6 schematically shows a cross-sectional view of a semiconductor device containing a TiN film according to an embodiment of the invention.

FIG. 6 schematically shows a cross-sectional view of a semiconductor device containing a TiN film according to an embodiment of the invention. In the schematic cross-sectional view, source and drain regions of a gate structure 90 are not shown. The gate structure 90 contains a substrate 92, a gate dielectric film 94, and a TiN gate electrode film 96 over the gate dielectric film 94. The substrate 92 can be a Si, Ge, SiGe, or GaAs substrate of any size, for example, a 200 mm substrate, a 300 mm substrate, or an even larger substrate. The gate dielectric film 94 can include a $SiO_2$ layer, a SiN layer, a SiON layer, or a combination thereof, alone or in combination with any other appropriate material, for example a high-dielectric constant (high-k) dielectric material. The high-k dielectric material can for example include metal oxides and their silicates, including $Ta_2O_5$, $TiO_2$, $ZrO_2$, $Al_2O_3$, $Y_2O_3$, $HfSiO_xN_y$, $HfSiN_y$, $HfSiO_x$, $HfO_xN_y$, $HfO_2$, $ZrSiO_xN_y$, $ZrSiN_y$, $ZrSiO_x$, $ZrO_xN_yZrO_2$, $TaSiO_x$, $SrO_x$, $SrSiO_x$, $LaO_x$, $LaSiO_x$, $YO_x$, or $YSiO_x$, or combinations of two or more thereof. The TiN gate electrode film 96 can be deposited utilizing embodiments of the invention and can, for example, have a thickness between 5 nm and 10 nm. The gate structure 90 may include different and fewer or more films than shown in FIG. 6. For example, a thin dielectric interface layer (not shown) may be located between the gate dielectric film 94 and the TiN gate electrode film 96, and a silicide film may be formed on the TiN gate electrode film 96 to reduce the electrical resistance of the gate structure 90.

While the invention has been illustrated by the description of several embodiments thereof, and while the embodiments have been described in considerable detail, they are not intended to restrict or in any way limit the scope of the appended claims to such detail. Additional advantages and modifications will readily appear to those skilled in the art. The invention in its broader aspects is therefore not limited to the specific details, representative systems and method and illustrative examples shown and described. Accordingly, departures may be made from such details without departing from the scope of the general inventive concept.

What is claimed is:

1. A method for depositing a TiN film for semiconductor manufacturing, the method comprising:
   providing a substrate in a process chamber; and
   depositing a TiN film on the substrate in a chemical vapor deposition (CVD) process by:
      heating the substrate to a temperature greater than 300° C. and less than 400° C.,
      exposing the substrate to a process gas comprising tetrakis(ethylmethylamino) titanium (TEMAT) precursor vapor and an inert carrier gas to thermally decompose the TEMAT precursor vapor on the substrate in a surface reaction limited regime, wherein a gas flow rate of the TEMAT precursor vapor is greater than 5 sccm, and
      maintaining a process chamber pressure equal to or less than 0.5 Torr during the exposing.

2. The method of claim 1, wherein the substrate is heated to a temperature between 350° C. and less than 400° C.

3. The method of claim 1, wherein the substrate is heated to a temperature of about 350° C.

4. The method of claim 1, wherein the process chamber pressure is maintained below 0.15 Torr.

5. The method of claim 1, wherein the process chamber pressure is maintained between 0.05 Torr and less than 0.5 Torr.

6. The method of claim 1, wherein the gas flow rate of the TEMAT precursor vapor is greater than 10 sccm.

7. The method of claim 1, wherein the inert carrier gas comprises a noble gas or $N_2$.

8. The method of claim 1, wherein the exposing further comprises exposing the substrate to a dilution gas selected from an inert gas and $H_2$.

9. The method of claim 1, wherein the depositing further comprises:
   flowing the inert carrier gas with a gas flow rate greater than 50 sccm through a precursor vaporization system in fluid communication with the process chamber and containing liquid TEMAT precursor vaporized at a temperature greater than 70° C., wherein the inert carrier gas captures the vaporized TEMAT precursor and transports the vapor to the process chamber.

10. The method of claim 1, wherein the TiN film forms a gate electrode over a gate dielectric film on the substrate.

11. The method of claim 1, further comprising:
   post-treating the TiN film with plasma-excited nitrogen precursor to incorporate additional nitrogen and reduce carbon content in at least a portion of a thickness of the TiN film.

12. The method of claim 11, wherein the nitrogen precursor comprises $N_2$, $NH_3$, $N(CH_3)_2$, $N(C_2H_5)_2$, $N_2H_4$, or $C_1$-$C_{10}$ hydrazine compounds.

13. The method of claim 11, wherein the nitrogen precursor is plasma-excited by a plasma source containing a slot plane antenna (SPA).

14. A method for depositing a TiN film for semiconductor manufacturing, the method comprising:
   providing a substrate in a process chamber;
   depositing a TiN film on the substrate in a chemical vapor deposition (CVD) process by:
      heating the substrate to a temperature between 350° C. and less than 400° C., exposing the substrate to a process gas consisting of a tetrakis(ethylmethylamino) titanium (TEMAT) precursor vapor and an inert carrier gas, to thermally decompose the TEMAT precursor vapor on the substrate in a surface reaction limited regime, wherein a gas flow rate of the TEMAT precursor vapor is greater than 5 sccm, and
      maintaining a process chamber pressure below 0.5 Torr during the exposing; and
   post-treating the TiN film with plasma-excited nitrogen precursor to incorporate additional nitrogen and reduce carbon content in at least a portion of a thickness of the TiN film.

15. The method of claim 14, wherein the nitrogen precursor comprises $N_2$, $NH_3$, $N(CH_3)_2$, $N(C_2H_5)_2$, $N_2H_4$, or $C_1$-$C_{10}$ hydrazine compounds.

16. The method of claim 14, wherein the nitrogen precursor is plasma-excited by a plasma source containing a slot plane antenna (SPA).

17. The method of claim 14, wherein the depositing further comprises:
   flowing the inert carrier gas with a gas flow rate greater than 50 sccm through a precursor vaporization system in fluid communication with the process chamber and containing liquid TEMAT precursor vaporized at a temperature greater than 70° C., wherein the inert carrier gas captures the vaporized TEMAT precursor and transports the vapor to the process chamber.

18. The method of claim 14, wherein the TiN film forms a gate electrode over a gate dielectric film on the substrate.

* * * * *